(12) United States Patent
Brun et al.

(10) Patent No.: US 7,510,962 B2
(45) Date of Patent: *Mar. 31, 2009

(54) METHOD FOR PRODUCING AN ANISOTROPIC CONDUCTIVE FILM ON A SUBSTRATE

(75) Inventors: Jean Brun, Champagnier (FR); Christiane Puget, Saint-Egreve (FR)

(73) Assignee: Commissariat a l'Energie Atomique, Paris (FR)

(*) Notice: Subject to any disclaimer, the term of this patent is extended or adjusted under 35 U.S.C. 154(b) by 482 days.

This patent is subject to a terminal disclaimer.

(21) Appl. No.: 10/563,627

(22) PCT Filed: Jul. 15, 2004

(86) PCT No.: PCT/FR2004/050335

§ 371 (c)(1), (2), (4) Date: Jan. 6, 2006

(87) PCT Pub. No.: WO2005/010926

PCT Pub. Date: Mar. 2, 2005

(65) Prior Publication Data

US 2006/0160270 A1    Jul. 20, 2006

(30) Foreign Application Priority Data

Jul. 18, 2003    (FR) .................................. 03 50352

(51) Int. Cl.
H01L 21/4763    (2006.01)

(52) U.S. Cl. ................. 438/637; 438/672; 257/E21.577

(58) Field of Classification Search ................. 438/637, 438/666–668, 672; 257/E21.577, E21.578
See application file for complete search history.

(56) References Cited

U.S. PATENT DOCUMENTS 5,135,606 A    8/1992    Kato et al.
6,228,689 B1    5/2001    Liu (Continued)

FOREIGN PATENT DOCUMENTS

EP    1 270 694    1/2003

(Continued)

OTHER PUBLICATIONS

Souriau J-C et al: "Electrical conductive film for Flip-Chip interconnection based on z-axis conductors", 2002 Proceedings 52nd. Electronic Components and Technology Conference, San Diego, CA , IEEE US, vol. Conf. 52, pp. 1151-1153 2002.

*Primary Examiner*—Hoai V Pham
(74) *Attorney, Agent, or Firm*—Oblon, Spivak, McClelland, Maier & Neustadt, P.C.

(57) ABSTRACT

This invention relates to a process for manufacturing an anisotropic conducting film comprising a layer of electrically insulating material and conducting through inserts, the process including the following steps: a) formation on a substrate of at least one layer of material with through holes, the layer being called the perforated layer, b) filling of the through holes to form conducting inserts. The process also includes production of a mask partially covering a first end of the conducting inserts and etching of the unmasked part of the ends of the conducting inserts so as to obtain conducting inserts with pointed ends. The invention is applicable to the formation of components (chips, integrated circuits) with a high interconnections density.

17 Claims, 9 Drawing Sheets

U.S. PATENT DOCUMENTS

| | | |
|---|---|---|
| 6,453,553 B1 | 9/2002 | Massit et al. |
| 7,026,239 B2 * | 4/2006 | Souriau et al. ............... 438/637 |
| 2001/0002044 A1 | 5/2001 | Ball et al. |

FOREIGN PATENT DOCUMENTS

| | | |
|---|---|---|
| JP | 07-320543 | 12/1995 |
| WO | 02/093991 | 11/2002 |

* cited by examiner

METHOD FOR PRODUCING AN ANISOTROPIC CONDUCTIVE FILM ON A SUBSTRATE

TECHNICAL DOMAIN

The invention relates to a process for manufacturing an anisotropic conducting film on a substrate. The invention also relates to a process for manufacturing a semiconducting chip provided with an anisotropic conducting film.

STATE OF PRIOR ART

With the widespread development of multimedia, many electronic devices have to be capable of quickly and easily managing, processing and transmitting a large quantity of information. These devices require an increase in the density of interconnections and a reduction of their weight and manufacturing cost. Therefore, considerable interest has been shown in interconnection methods in which the active face of the chip faces the substrate on which the said chip is to be transferred. This has a number of advantages for packaging in microelectronics.

There are several large families of techniques for connecting chips and integrated circuits to interconnection substrates, for example the so-called "flip-chip" ball connection technique and the ACF (Anisotropic Conductive Film) technique. These techniques have a number of advantages for the integration of circuits. Considering the distribution of interconnection pads on the surface, they can be used to connect chips with a high interconnection density within a small volume while maintaining or improving electrical performances, particularly by reducing self-inductance effects. For example, these techniques are used in cell phones and more generally in multimedia devices. In particular, these techniques can be used to transmit high speed data, comparable to the wire bonding method.

The predominant "flip-chip" technique at the moment is the meltable micro-balls technology. This technology is based on the use of a process on a complete wafer of semiconducting material requiring two lithography levels: a first level at which the micro-ball bonding metallurgy is defined and a second level at which the meltable materials are deposited by electrolysis. This process cannot be used for interconnection of cut chips or when the number of wafers to be processed is too small to justify the design of special masks necessary for the lithography step.

The ACF technique concerns conducting films made from conducting particles integrated into an isolating film or metallic inserts included in an isolating film. ACF films with conducting particles integrated in an insulating film are best known. This type of film is based on random distribution of conducting particles in a polymer matrix. The typical diameter of conducting particles is a few micrometers. They are either polymer balls covered with metal, or metal balls that may for example be made of nickel or silver. The interconnection is made by gluing the film between the substrate and the chip, gluing being followed by thermocompression. Interconnection of a chip and a substrate using a film with conducting particles is shown in FIG. 1A. A chip 1 provided with conducting pads 5 is connected to a substrate 2 provided with conducting pads 7. An ACF film composed of an insulating film 3 in which conducting particles 4 are incorporated is placed between the chip and the substrate. Bosses 6 establish the contact between the conducting pads and the ACF film. This type of interconnection results in a relatively high electrical contact resistance, which reduces the field of its application domains. For example, one known application is the domain of flat screens.

The disadvantage mentioned above leads to the design of ACF films with metallic through inserts. The production of an ACF film with metallic through inserts is based on the ordered insertion of metallic microstructures into a polymer layer. The interconnection of a chip and a substrate using a film with metallic through inserts is shown in FIG. 1B. The ACF film is composed of an insulating film 8 in which metallic inserts 9 are placed. A high redundancy of the number of contacts per pad ensures homogenous contact with low resistivity capable of carrying high currents.

However, the use of ACF films introduces several problems including the problem of reliability of the electrical contact. Oxidised layers are formed on the ends of the metallic inserts and on chip interconnection pads, which considerably reduces the quality of the Electrical contacts. One solution to this problem has been proposed, namely the addition of a meltable material at the ends of the metallic inserts. However, the meltable material can creep while it is melting, and consequently can short circuit the metallic inserts. Furthermore, impurities can be introduced between the film and the chip or between the film and its substrate during hybridisation.

Another problem is related to handling of thin ACF films. The films are made on a rigid sacrificial support that has to be separated from the ACF film before hybridisation. Three elements (the chip, the film and the substrate) then have to be assembled.

The present invention does not have the disadvantages mentioned above.

PRESENTATION OF THE INVENTION

The invention relates to a process for manufacturing an anisotropic conducting film comprising a layer of electrically insulating material and conducting through inserts. The process is characterised in that it comprises the following steps:

a) formation on a substrate of at least one layer of material with through holes, the said layer being called the perforated layer, b) filling of the through holes to form conducting inserts, and is characterised in that it also comprises production of a mask partially covering a first end of the conducting inserts and etching of the unmasked part of the end of the conducting inserts so as to obtain conducting inserts with pointed ends.

According to one particular embodiment in which the filling step b) is done by electrolysis, step a) comprises deposition of a conducting layer on the substrate before formation of the perforated layer, this layer being etched after the conducting inserts are made. This layer may be etched (usually by a wet or dry method), at any possible time during the process once the conducting inserts have been made; the layer is not necessarily etched immediately after the filling step of the through holes.

Advantageously, the perforated layer in step a) is done by depositing a layer of photosensitive resin, insolation of this resin through a mask and development of this resin to obtain the through holes. The perforated layer may also be a layer of material deposited by screen printing, for example a polymer or even a metal, or a layer made by thermal oxidation and etched to obtain the through holes, or a preformed layer to make the through holes and transferred onto the substrate.

Advantageously, the perforated layer in step a) is removed after the filling step b) and a step to deposit an insulating layer is performed on the substrate to form the insulating layer of the anisotropic conducting film. This variant is used particularly when the perforated layer makes it impossible to isolate the conducting inserts and/or to make them asymmetric after assembly.

Advantageously, a passivation layer covers the substrate in which at least one contact pad is housed. This embodiment is used particularly when the conducting film is made directly on the substrate that must be connected with another component.

According to one particular embodiment, production of the mask partially covering one end of the conducting inserts and etching of the unmasked part comprise the following steps:

deposition of a photosensitive resin on the perforated layer in which the conducting inserts are formed, insolation and development of the photosensitive resin through the mask such that only a disk of resin remains at the top of a first end of each conducting insert, isotropic chemical etching of the first ends of the conducting inserts until the resin disks are removed such that a point appears at the end of each conducting insert.

According to another particular embodiment, production of the mask partially covering one end of the conducting inserts and etching of the unmasked part comprise the following steps:

coating of a buffer substrate by a material that can be transferred and that will protect the end of the conducting inserts, transfer of the said material onto the conducting inserts such that only a disk of material remains at the top of the first end of each conducting insert, isotropic chemical etching of the first ends of the conducting inserts until the material disks are removed such that a point appears on the first end of each conducting insert.

Advantageously, the step in which the through holes are filled is done such that the first end of each conducting insert is in the form of a nail head. In other words, the first end of each conducting insert may be in the form of a cap or a mound shaped like a nail head.

Advantageously, after the first ends of the conducting inserts have been made with pointed ends, a protection layer is formed on the points of the conducting inserts.

In this case, the protection layer is advantageously an anti-oxidising layer. And the anti-oxidising layer is preferably gold plating done by a technique chosen from among electroless plating, electrolysis or spraying of gold.

If it is decided to carry out the process including several steps including a step to coat a buffer substrate with a transfer material, a step to transfer the said material onto the conducting inserts and isotropic chemical etching of the first ends of the said conducting inserts, the transfer of the transferable material designed to protect the end of the conducting inserts may advantageously be a polymer or a resin with better adhesive properties on the conducting inserts than on the buffer substrate on which the material is located before the transfer.

The material that can be transferred onto a first end of the conducting inserts may advantageously be transferred by applying pressure on the buffer substrate on which the material is located before the transfer. This transfer may be done with or without heating.

Advantageously, the through holes are filled using a technique chosen from among an auto catalytic deposition, electrolytic growth, chemical or physical deposition and impregnation.

According to one particular embodiment prior to step a), one or several layers are deposited on the substrate that make it possible to separate the film from the substrate after the film has been obtained, and to make the assembly mechanically stiff.

The invention also relates to a process for manufacturing a semiconducting chip. This process includes a process for manufacturing an anisotropic conducting film on a semiconducting wafer according to the invention, and a step to cut out the structure thus obtained.

In one of the embodiments of this invention, the anisotropic conducting film may be made directly on a wafer of semiconducting material in which active and/or passive integrated circuit type elements are present. In general, the anisotropic conducting film obtained using the process according to the invention can be used to connect at least two components, the conducting film possibly being made on at least one of the said components and the said component possibly containing conducting areas or being completely conducting. The process according to the invention can provide an excellent electrical bond between the metals put into contact. Conducting inserts can be connected to interconnection pads practically irreversibly, due to a non-meltable bonding material. In particular, the anisotropic conducting film according to the invention can be used to make contacts between the chip and the substrate with a low electrical resistance, good mechanical strength and good reliability.

BRIEF DESCRIPTION OF THE DRAWINGS

Other characteristics and advantages of the invention will become clearer after reading a preferred embodiment of the invention with reference to the appended figures, wherein.

The same marks denote the same elements in all Figures.

DETAILED PRESENTATION OF PARTICULAR EMBODIMENTS

The invention can be used to make a semiconducting chip with a passivation layer on one face, at least one opening being formed in the layer through which a connection pad can be seen. This chip comprises an anisotropic conducting film on the passivation layer and the connection pad, formed from conducting inserts gripped in an electrically insulating material, each conducting insert having a first end that projects outside the electrically insulating material and a second end that is brought into contact with the passivation layer or the connection pad through a conducting element.

Advantageously, the first ends of the conducting inserts are in the form of points.

According to one variant, the electrically insulating material may be a polyimide, a thermoplastic material, a photosensitive resin or a glue.

According to another variant, the electrically insulating material may be a meltable glass.

Figure 1A:
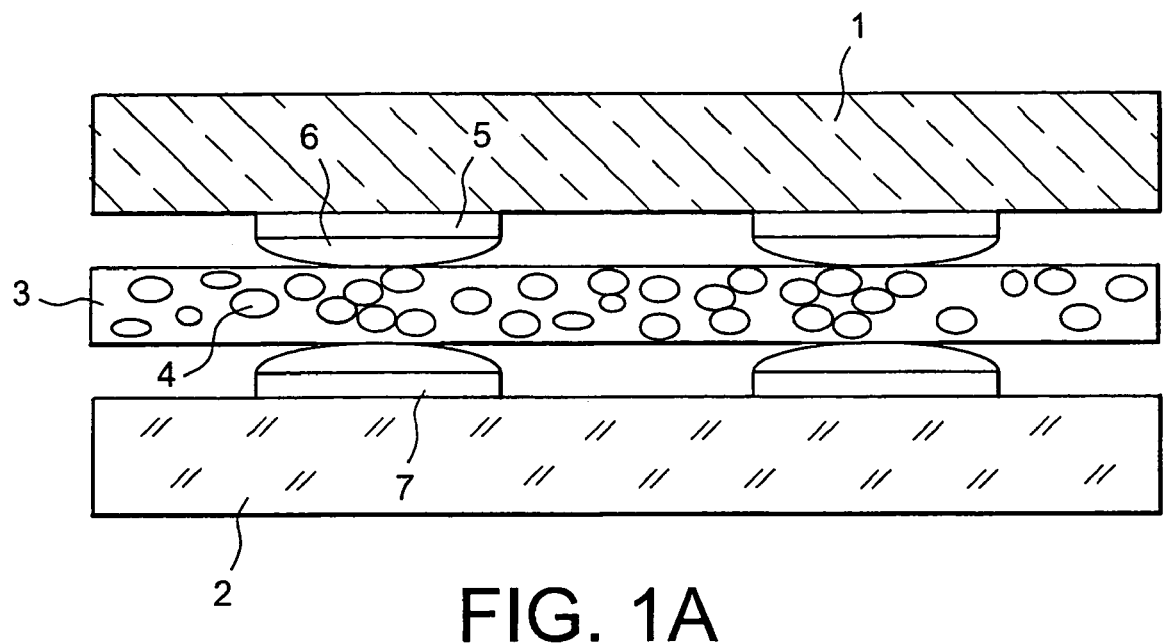
FIGS. 1A and 1B, already described, show the interconnection of a chip and a substrate according to known art, using an anisotropic conducting polymer film with conducting particles, and an anisotropic conducting polymer film with conducting inserts, respectively.
Figure 1B:
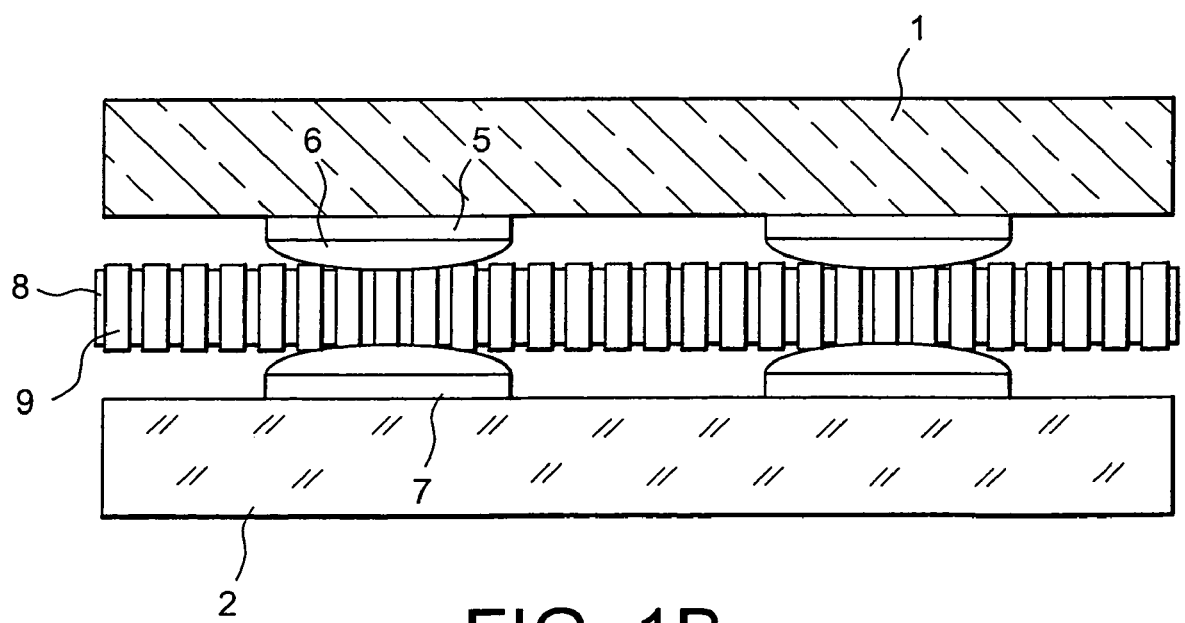
Figure 2:
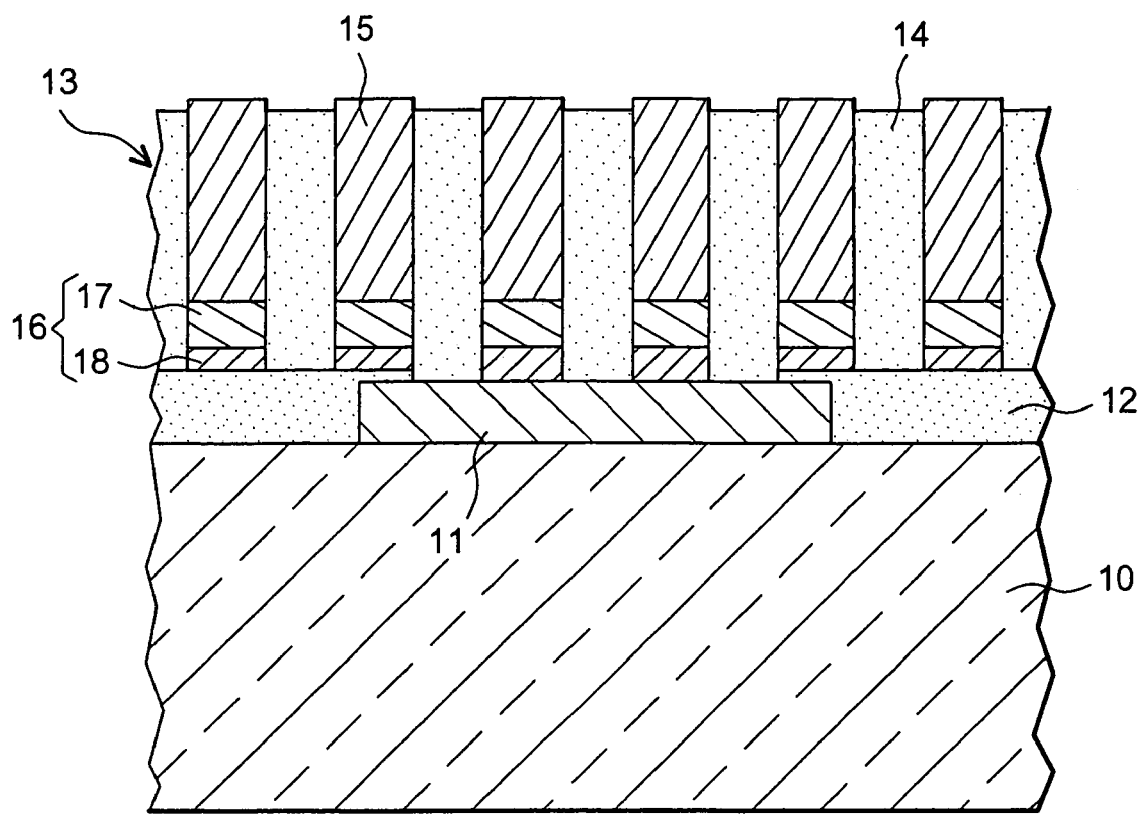
FIG. 2 shows a chip equipped with an anisotropic conducting polymer film according to the invention.

FIG. 2 shows an example of a semiconducting chip equipped with an anisotropic conducting polymer film according to the invention.

A chip 10 is equipped with an interconnection pad 11 placed in an opening of a passivation layer 12. A conducting film 13 comprising a layer of electrically insulating material 14 in which conducting inserts 15 are placed covers the passivation layer 12 and the connection pad 11. A conducting insert 15 (for example a metallic insert) has a first end that projects above the insulating film 14 and a second end connected through a conducting element 16 to the passivation layer 12 or the conducting pad 11. The conducting element 16 consists of a metallic disk 17 and a bonding element 18.

The process for manufacturing a conducting polymer film on a semiconducting wafer according to the invention will now be described with reference to FIGS. 3A-3I.

The process is implemented starting from a wafer of a semiconducting material. A semiconducting wafer T is covered on one face by a passivation layer 12 in which openings are formed, exposing connection pads 11 (see FIG. 3A).

Figure 3A:
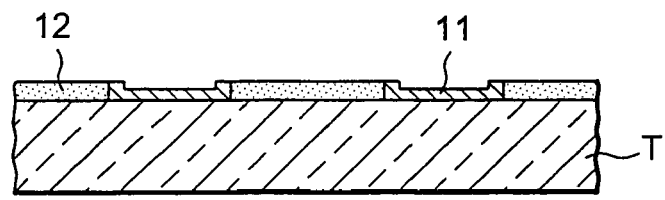
FIGS. 3A-3I show a process for manufacturing an anisotropic conducting polymer film on a semiconductor wafer according to the invention.
Figure 3B:
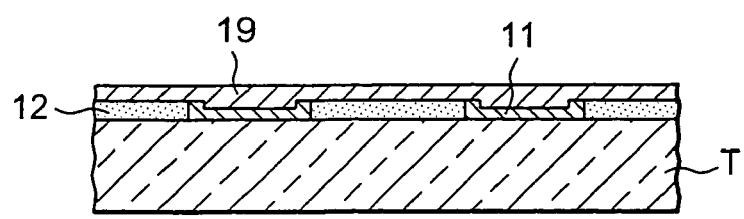

The first step in the process is deposition of a complete layer of a conducting and bonding material 19 on the passivation layer 12 and the connection pads 11 (see FIG. 3B). For example, the conducting and bonding material 19 may be Ti, Cr, W, Ta, etc. This step is preferably done after stripping the surface of the pads.

Figure 3C:
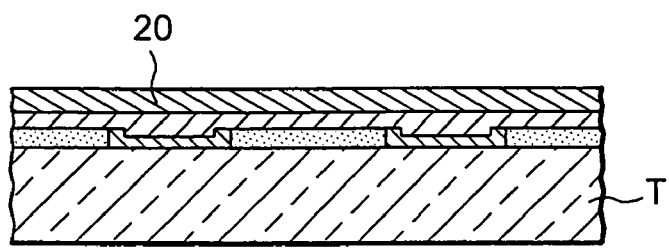

At least one metallic layer 20 (Cu, Ni, Ti, Au, Al, etc.) is then deposited on the layer 19 (see FIG. 3C). The metallic layer 20 will be used as a layer through which an electrical current is input at the time of the electrolytic growth of the conducting inserts.

Figure 3D:
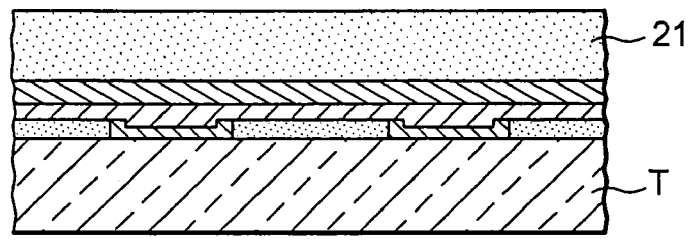

A layer of resin type photosensitive polymer 21 is then deposited on the metallic layer 20 (see FIG. 3D). The thickness of the layer of the photosensitive polymer 21 is between a few μm and a few tens of μm.

Figure 3E:
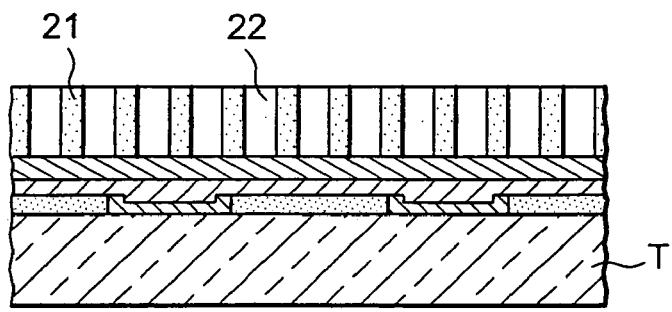

The layer 21 is then insolated through a mask so as to form through holes 22 (see FIG. 3E). Typically, the depth of the holes may be between a few μm and several tens of μm, depending on the thickness of the layer 21. The mask used for the formation of holes enables uniform and redundant distribution of the holes. Note that the layer in which the through holes are formed may be a layer of material deposited by screen printing, for example a polymer or even a metal, or a layer made by thermal oxidation etched to make the holes, or a preformed layer to make the holes and transferred onto the substrate.

Figure 3F:
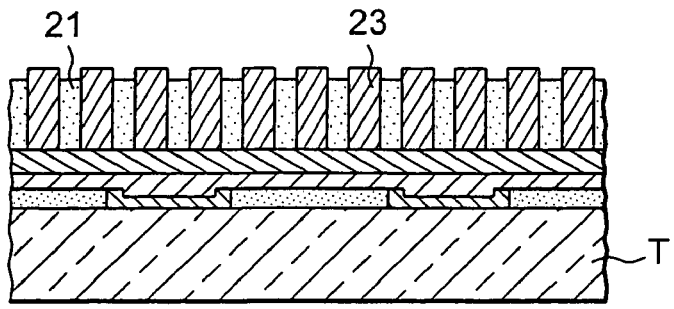

The holes formed in the previous step are then filled with one or several conducting materials (Cu, Ni, Ti, Cr, W, SnPb, Au, Ag, etc.), for example electrolytically, to form conducting inserts 23 (see FIG. 3F). Therefore, the inserts can be formed from a single conducting material or from several superposed conducting materials. These holes can be filled electrolytically. The wafer on which the layer 21 was deposited, perforated with through holes 22 (in other words layer 20) is connected to the cathode, and the voltage is of the order of 2 V for a current of 10 mA. For example, for a deposit of Ni, the electrolyte used is a mix of Ni sulphate and chloride. The holes can also be filled by electroless plating. In this case, the first step is zincatation of surfaces to be coated in the basic medium, and electroless plating is then done in a special bath.

Figure 3G:
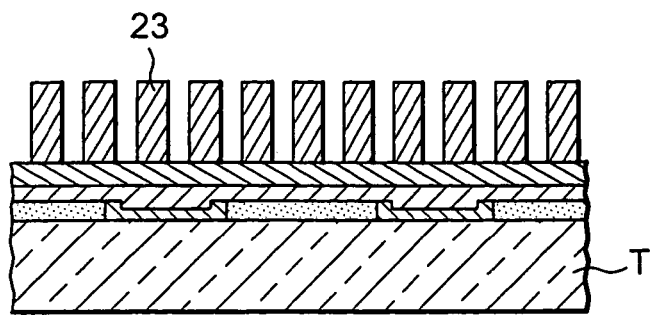
Figure 3H:
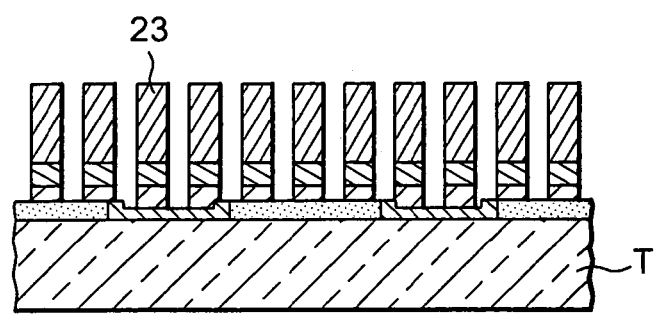

The resin is then eliminated, for example by dissolution (see FIG. 3G) and the metallic layers deposited in a solid layer are selectively etched in the areas located between the inserts (see FIG. 3H). Note that these metallic layers may be etched at any time during the process once the inserts have been made. The connection pads 11 are then electrically insulated from each other. This step can be done using a dry or chemical method, the chemical method being preferred.

Figure 3I:
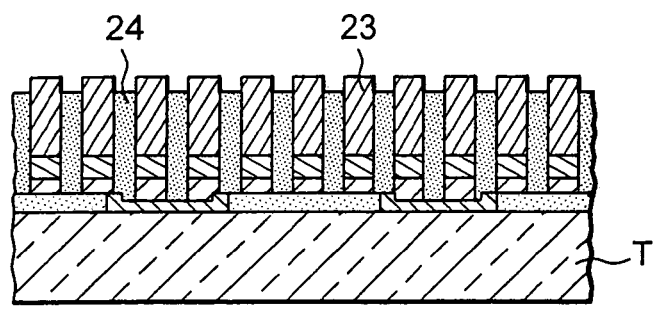

An electrically insulating material 24 is then deposited on the wafer, partially covering the metallic inserts (see FIG. 3I).

If the electrically insulating material entirely covers the inserts, the first step is etching to expose them. This material is preferably a polymer such as a polyimide, a thermoplastic material, a photosensitive resin or any type of glue. It is also possible to spread a meltable glass, commonly called "Spin On Glass". Note that this step to insulate the conducting inserts is applied particularly when the perforated layer is not compatible with the insulation of inserts and/or obtaining asymmetry by assembly.

All that is necessary to obtain a semiconducting chip according to the invention is to cut out the semiconducting wafer covered with an anisotropic conducting polymer film into as many elementary chips as necessary.

One variant of the process for manufacturing a conducting polymer film according to the invention will now be described with reference to FIGS. 4A-4F. According to this variant, the conducting inserts have a pointed end to improve the electrical contact of the anisotropic conducting polymer film and the substrates on which the chips are to be transferred.

The process according to the variant of the invention comprises additional steps between the step for formation of conducting inserts (see FIG. 3F) and the step for elimination of the layer of photosensitive polymer (see FIG. 3G). According to the variant of the invention, in this case the step for formation of conducting inserts is followed by the deposition of a photosensitive resin 25 on all inserts (see FIG. 4A). The photosensitive resin is insolated through a mask such that only a resin disk 26 remains at the top of each insert (see FIG. 4B). Note that the resin 21 is hardened by annealing at 150° C. for 5 minutes before the photosensitive resin is deposited. An isotropic etching of the inserts is then done, for example by a wet or dry method (for example dilute nitric acid for nickel inserts) (see FIG. 4C) until the resin disks have disappeared (see FIG. 4D). A point 27 then appears at the end of each insert.

Figure 4A:
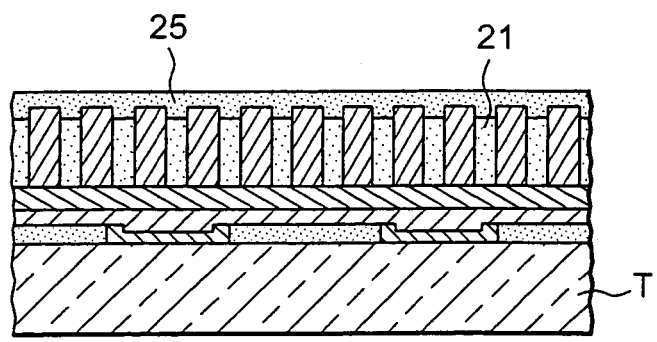
FIGS. 4A-4F show a variant of the manufacturing process shown in FIGS. 3A-3I.
Figure 4B:
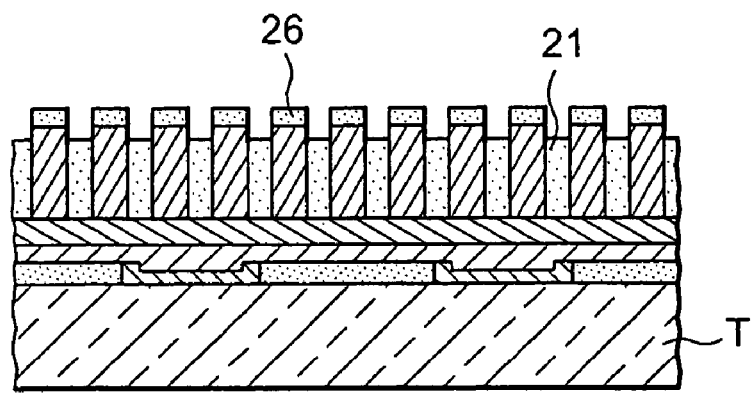
Figure 4C:
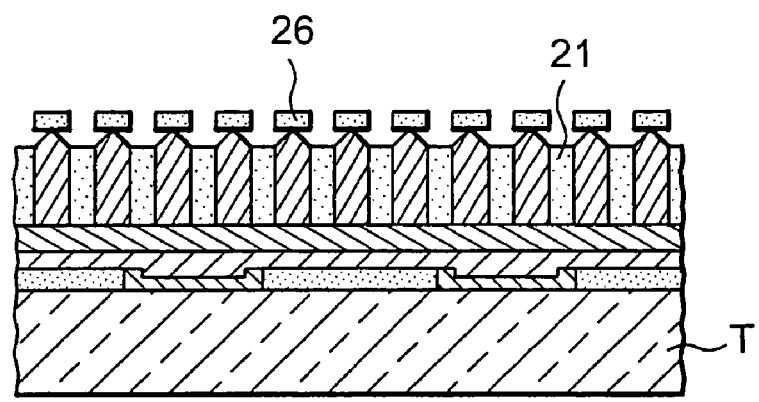
Figure 4D:
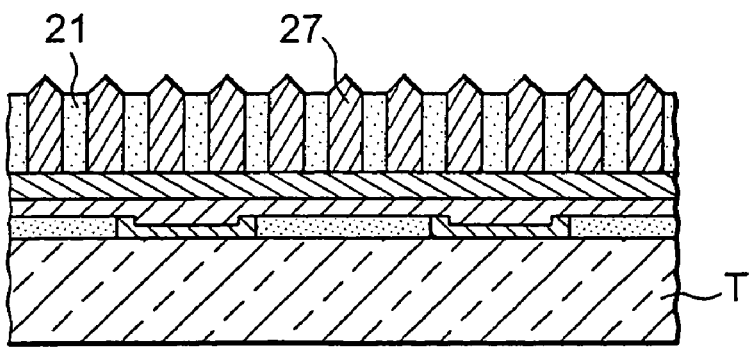
Figure 4E:
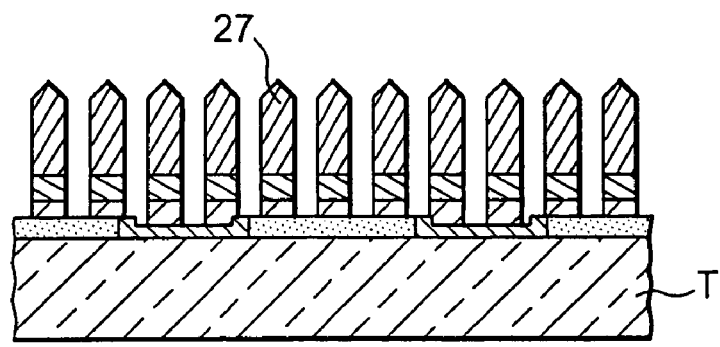
Figure 4F:
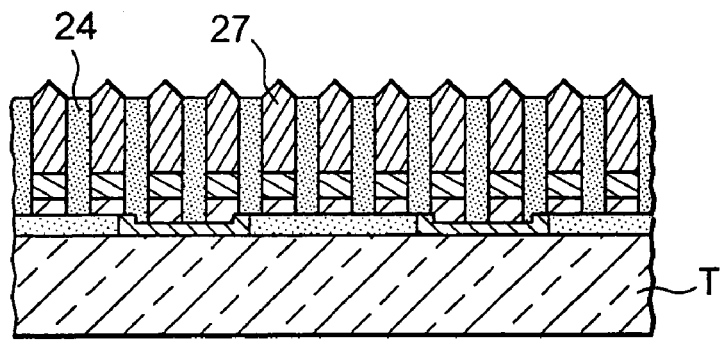

The process then continues following the steps mentioned above, namely elimination of the layer of photosensitive polymer and selective etching of the metallic layers deposited as a complete layer (see FIG. 4E). The selective etching of metallic layers is followed by deposition of an electrically insulating material 24 covering the inserts except for the points 27 (see FIG. 4F).

Another variant of the process for manufacturing a conducting polymer film according to the invention is described with reference to FIGS. 5A-5J. According to this variant, the conducting inserts also have a pointed end, but a material transfer technique rather than a masking step is used to partially mask the ends of the said inserts.

The manufacturing process according to this variant of the invention begins with the same steps 3A to 3E as described above. The next step is then formation of the conducting inserts using the same method as that described above, with the difference that the conducting material(s) forming the inserts project(s) beyond the top of the hole such that the ends of the inserts are in the shape of a nail head (see FIG. 5A).

The next step is then deposition of a resin 25 on all inserts. This is done by coating a substrate A (Si, glass, metal or polymer) with a resin to protect the ends of the inserts (see FIG. 5B). The resin may be a photosensitive resin used in microelectronics or any polymer that has better adhesive properties on metallic inserts than onto the substrate A. The resin 25 is transferred onto the inserts with or without heating, by applying pressure on the buffer substrate A (see FIG. 5C). For example, if the diameter of the substrate A is 100 mm, a pressure of 10 kg will be applied. And the substrate A is removed (see FIG. 5D).

Figure 5A:
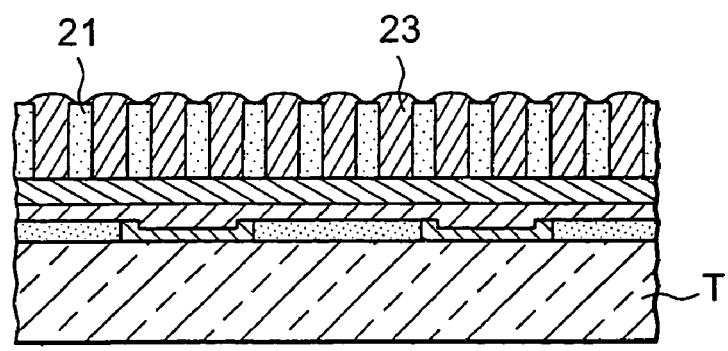
FIGS. 5A-5J show another variant of the manufacturing process shown in FIGS. 3A-3I.
Figure 5B:
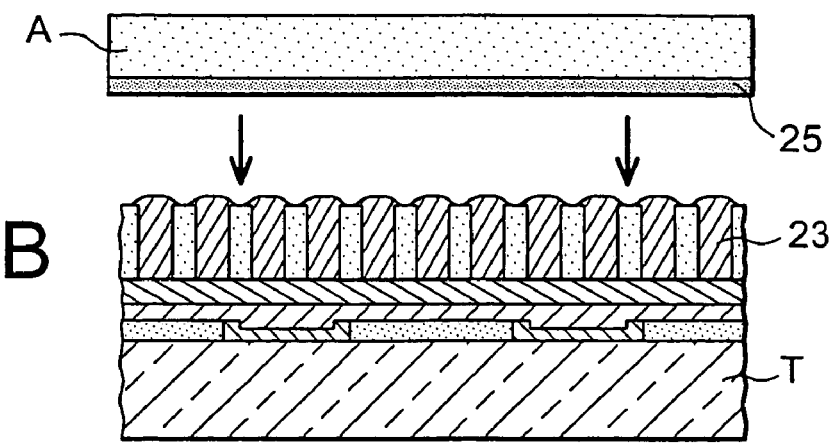
Figure 5C:
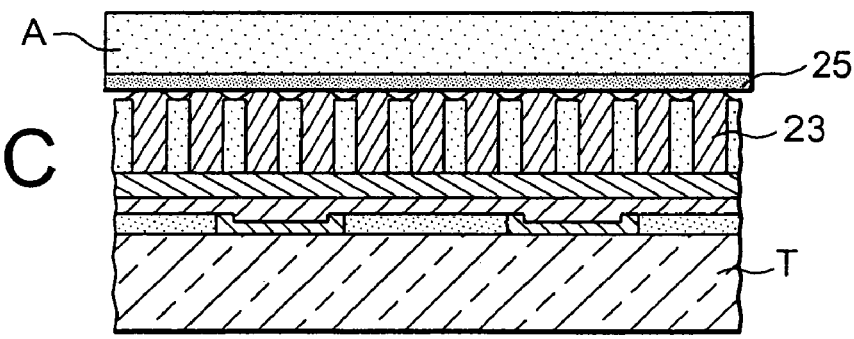
Figure 5D:
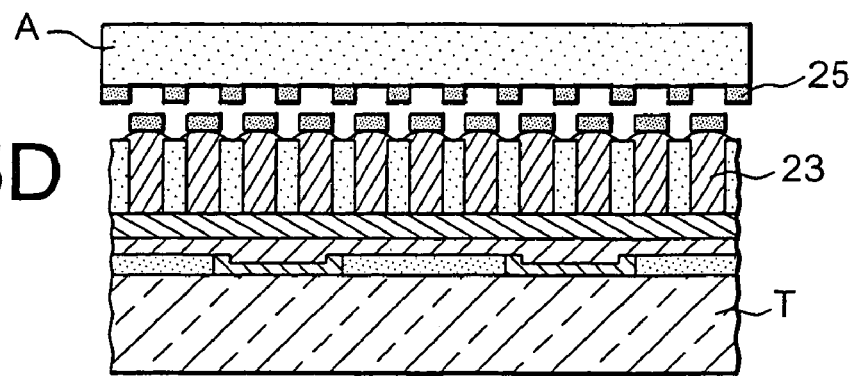
Figure 5E:
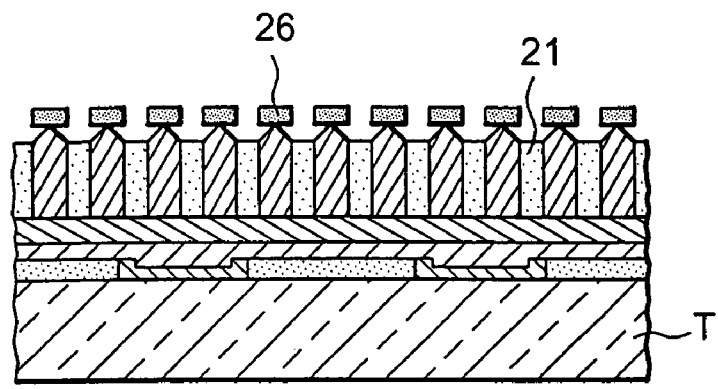
Figure 5F:
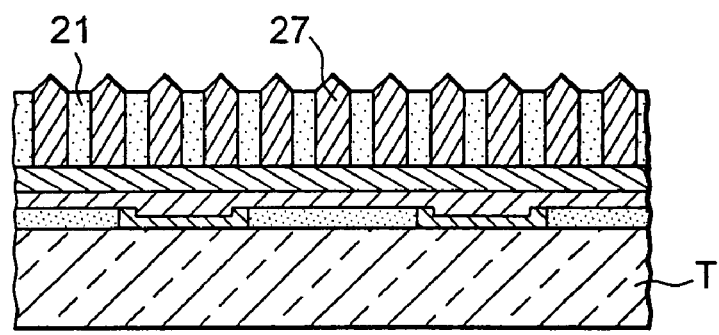

The next step is then isotropic etching of the ends of the inserts so as to form inserts with pointed ends (see FIG. 5E). For example, etching may be done using a wet or dry method. For example, if the material from which inserts are made is nickel, the etching solution may for example consist of $H_2O$ (DI)+$H_2SO_4$+$(NH_4)2S_2O_8$. A point 27 then appears at the end of each insert. The presence of this pointed end on each conducting insert can improve the electrical contact of the anisotropic conducting polymer film and substrates on which the chips are to be transferred. During the etching, resin disks on the inserts will separate by themselves or they may be dissolved in a solvent of the resin 25 (see FIG. 5F).

Figure 5G:
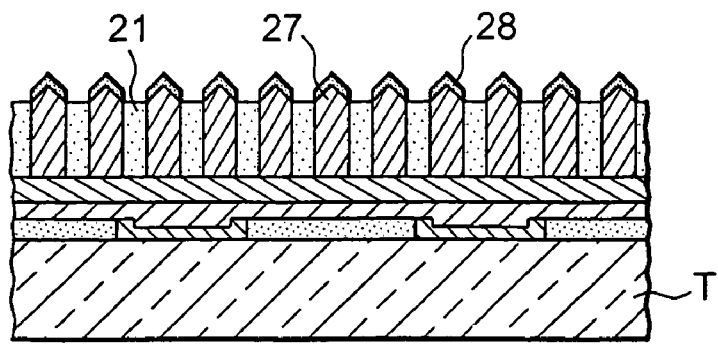
Figure 5H:
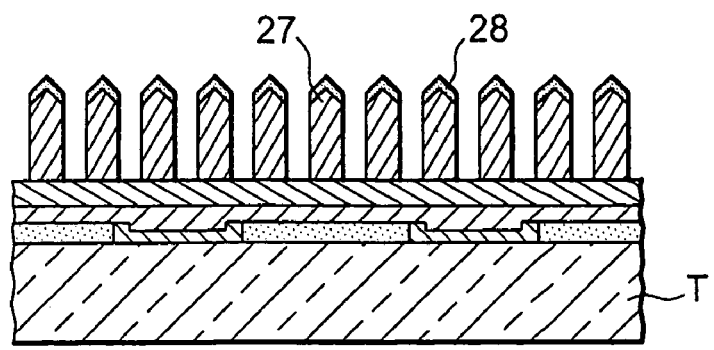

Gold plating 28 of the points 27 of the inserts may for example be done by electroless plating or by gold electrolysis (see FIG. 5G).

Figure 5I:
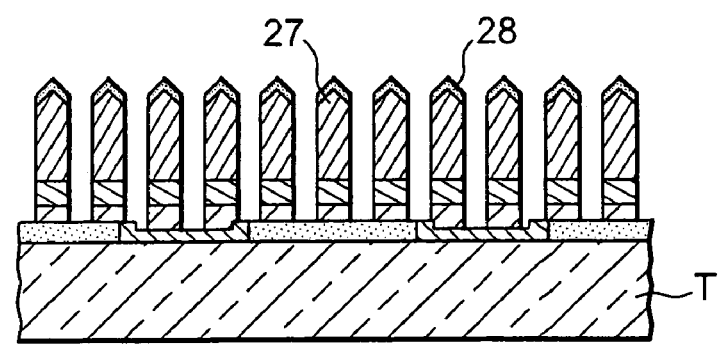
Figure 5J:
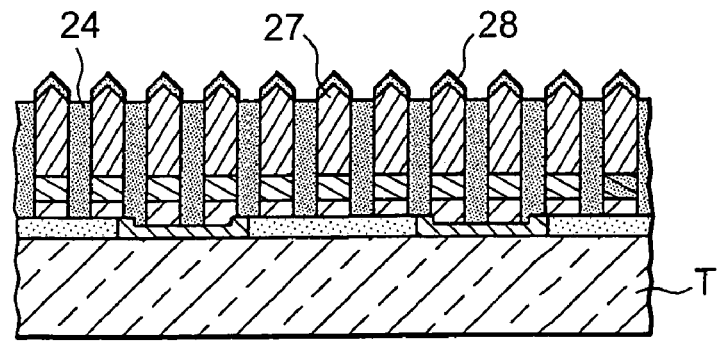

Finally, the layer of photosensitive polymer is eliminated, for example by dissolution in a solvent or "LE posistrip" (see FIG. 5H) and the metallic layers deposited as complete layers, in other words layers 19 and 20, are selectively etched in the areas located between the inserts (see FIG. 5I).

In the last step, the connection pads 11 are then electrically insulated from each other. This step can be done by a dry or a chemical method, the chemical method being preferred. The result is a layer of electrically insulating material 24 covering the inserts except for the points 27 (see FIG. 5J). This material is preferably a polymer such as a polyimide, a thermoplastic material, a photosensitive resin or any type of glue. It is also possible to spread a meltable glass, commonly called Spin On Glass. If the insulating material covers the inserts entirely, etching could be done to expose the points 27.

Using a material transfer technique rather than a masking step to partially mask the ends of the inserts, avoids the need for the deposition, alignment, insolation steps and the step to develop a resin, which are all expensive (manufacturing of the mask and long process time) and difficult (alignment of the mask) steps.

The presence of an anisotropic conducting polymer film made directly on a chip, as described in the different embodiments above, considerably simplifies the process for hybridisation of the chip on a substrate. It is then no longer necessary to handle a film to insert it between the chip and the substrate. Only two elements need to be handled, namely the chip and the substrate. Moreover, due to the bond layer present under the inserts, the quality of the electrical contact between the anisotropic conducting polymer film and the chip is very good.

Other advantages of the process according to the invention could be mentioned. Thus, manufacturing of an anisotropic conducting polymer film according to the invention does not require a critical alignment step since the redundancy of the holes made during the etching step (see FIG. 3E) means that there are redundant conducting inserts such that there will necessarily be some inserts above the pads to be connected. Another advantage is that manufacturing of an anisotropic conducting polymer film according to the process of the invention makes it possible to use any type of polymer, or even any type of meltable glass.

Anisotropic conducting films may be used in many technical domains particularly for sensors or Micro-Electronic Mechanical Systems (MEMS). In particular, one application for which the process according to the invention may be used is to make active protection systems for smart cards. For example, a screen containing safety elements is connected and glued irreversibly to the chip. Apart from good electrical contact, the gluing interface must be as thin as possible to make dissolution of glue by chemical agents difficult, even when hot. This process is advantageous not only in that it can be used to make the required connection, but also that its cost is low.

The invention claimed is:

1. A process for manufacturing an anisotropic conducting film comprising a layer of electrically insulating material and conducting through inserts, said process comprising:
    a) forming on a substrate of at least one layer of material with through holes, the said layer being called the perforated layer,
    b) filling of the through holes to form conducting inserts;
    and further comprising producing a mask partially covering a first end of the conducting inserts and etching of the unmasked part of the ends of the conducting inserts so as to obtain conducting inserts with pointed ends.

2. The process according to claim 1, wherein the filling step b) is done by electrolysis, step a) comprises deposition of a conducting layer on the substrate before formation of the perforated layer, this layer being etched after the conducting inserts are made.

3. The process according to claim 1, wherein the perforated layer in step a) is done by depositing a layer of photosensitive resin, insolation of this resin through a mask and development of this resin to obtain the through holes.

4. The process according to claim 1, wherein the perforated layer in step a) is removed after the filling step b) and a step to deposit an insulating layer is performed on the substrate to form the insulating layer of the anisotropic conducting film.

5. The process according to claim 1, wherein a passivation layer covers the substrate in which at least one contact pad is housed.

6. The process according to claim 1, wherein production of the mask partially covering one end of the conducting inserts and etching of the unmasked part comprises:
    depositing a photosensitive resin on the perforated layer in which the conducting inserts are formed,
    insolating and developing the photosensitive resin through the mask such that only a disk of resin remains at the top of a first end of each conducting insert,
    isotropic chemical etching of the first ends of the conducting inserts until the resin disks are removed such that a point appears at the end of each conducting insert.

7. The process according to claim 1, wherein the through holes are filled utilizing at least one technique selected from the group consisting of an auto catalytic deposition, electrolytic growth, chemical deposition, physical deposition and impregnation.

8. A process for manufacturing a semiconducting chip, wherein the process includes a process for manufacturing an anisotropic conducting film according to claim 1, said film being placed on a semiconducting wafer, and a step to cut out the structure thus obtained.

9. A process for manufacturing an anisotropic conducting film comprising a layer of electrically insulating material and conducting through inserts, said process comprising:
    a) forming on a substrate of at least one layer of material with through holes, the said layer being called the perforated layer,
    b) filling of the through holes to form conducting inserts;
    and further comprising producing a mask partially covering a first end of the conducting inserts and etching of the unmasked part of the ends of the conducting inserts so as to obtain conducting inserts with pointed ends, wherein production of the mask partially covering one end of the conducting inserts and etching of the unmasked part comprises:

coating of a buffer substrate (A) by a material that can be transferred and that will protect the end of the conducting inserts, transferring said material onto the conducting inserts such that only a disk of material remains at the top of the first end of each conducting insert, isotropic chemical etching of the first ends of the conducting inserts until the material disks are removed such that a point appears on the first end of each conducting insert.

10. The process according to claim 9, wherein the step in which the through holes are filled is done such that the first end of each conducting insert is in the form of a nail head.

11. The process according to claim 9, wherein the transfer of the transferable material designed to protect the end of the conducting inserts is a polymer with better adhesive properties on the conducting inserts than on the buffer substrate (A) on which the material is located before the transfer.

12. The process according to claim 9, wherein the transfer of the transferable material designed to protect the end of the conducting inserts is a resin with better adhesive properties on the conducting inserts than on the buffer substrate (A) on which the material is located before the transfer.

13. The process according to claim 9, wherein the material that can be transferred onto the end of the conducting inserts is transferred by applying pressure on the buffer substrate (A) on which the material is located before the transfer.

14. A process for manufacturing an anisotropic conducting film comprising a layer of electrically insulating material and conducting through inserts, said process comprising:

a) forming on a substrate of at least one layer of material with through holes, the said layer being called the perforated layer, b) filling of the through holes to form conducting inserts;

and further comprising producing a mask partially covering a first end of the conducting inserts and etching of the unmasked part of the ends of the conducting inserts so as to obtain conducting inserts with pointed ends, wherein after the first pointed ends of the conducting inserts have been made, a protection layer is formed on the points of the conducting inserts.

15. The process according to claim 14, wherein the protection layer is advantageously an anti-oxidising layer.

16. The process according to claim 15, wherein the anti-oxidising layer is gold plating prepared by at least one technique selected from the group consisting of electroless plating, electrolysis and spraying of gold.

17. A process for manufacturing an anisotropic conducting film comprising a layer of electrically insulating material and conducting through inserts, said process comprising:

a) forming on a substrate of at least one layer of material with through holes, the said layer being called the perforated layer, b) filling of the through holes to form conducting inserts;

and further comprising producing a mask partially covering a first end of the conducting inserts and etching of the unmasked part of the ends of the conducting inserts so as to obtain conducting inserts with pointed ends, wherein prior to manufacturing of the film, one or several layers are deposited on the substrate that make it possible to separate the film from the substrate after the film has been obtained, and to make the assembly mechanically stiff.

* * * * *